(12) United States Patent
Garofalo

(10) Patent No.: US 11,881,253 B2
(45) Date of Patent: Jan. 23, 2024

(54) AVERAGE REFERENCE VOLTAGE FOR SENSING MEMORY

(71) Applicant: Micron Technology, Inc., Boise, ID (US)

(72) Inventor: Pierguido Garofalo, San Donato Milanese (IT)

(73) Assignee: Micron Technology, Inc., Boise, ID (US)

( * ) Notice: Subject to any disclaimer, the term of this patent is extended or adjusted under 35 U.S.C. 154(b) by 122 days.

(21) Appl. No.: 17/544,471

(22) Filed: Dec. 7, 2021

(65) Prior Publication Data

US 2023/0178144 A1  Jun. 8, 2023

(51) Int. Cl.
*G11C 11/4091* (2006.01)
*G11C 11/4099* (2006.01)
*G11C 5/06* (2006.01)
*G11C 11/4096* (2006.01)
*G11C 11/4074* (2006.01)

(52) U.S. Cl.
CPC ............ *G11C 11/4091* (2013.01); *G11C 5/06* (2013.01); *G11C 11/4074* (2013.01); *G11C 11/4096* (2013.01); *G11C 11/4099* (2013.01)

(58) Field of Classification Search
CPC ... G11C 11/4091; G11C 5/06; G11C 11/4074; G11C 11/4096; G11C 11/4099
See application file for complete search history.

(56) References Cited

U.S. PATENT DOCUMENTS

| | | | |
|---|---|---|---|
| 11,056,178 B1* | 7/2021 | Bedeschi | G11C 11/2273 |
| 2007/0014144 A1* | 1/2007 | Wicker | G11C 13/0004 365/148 |

* cited by examiner

*Primary Examiner* — Min Huang
(74) *Attorney, Agent, or Firm* — Brooks, Cameron & Huebsch, PLLC

(57) ABSTRACT

The present disclosure includes apparatuses, methods, and systems for using an average reference voltage for sensing memory. An embodiment includes a memory having a plurality of memory cells coupled to a common node driver, where a group of the memory cells are coupled to an access line and each respective memory cell of the group is coupled to a different respective sense line, sense circuitry coupled to the different respective sense lines, and circuitry configured to apply an average reference voltage from the common node driver to the sense circuitry during a sense operation being performed on the group of memory cells coupled to the access line.

20 Claims, 3 Drawing Sheets

VREF = VX - VCN + <VSIGNAL>

AVERAGE REFERENCE VOLTAGE FOR SENSING MEMORY

TECHNICAL FIELD

The present disclosure relates generally to semiconductor memory and methods, and more particularly, to using an average reference voltage for sensing memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Memory devices can include memory cells that can store data based on the charge level of a storage element (e.g., a capacitor) or can store data based on their conductivity state. Such memory cells can be programmed to store data corresponding to a target data state by varying the charge level of the storage element (e.g., different levels of charge of the capacitor may represent different data sates) or by varying the conductivity level of the storage element. For example, sources of an electrical field or energy, such as positive or negative electrical pulses (e.g., positive or negative voltage or current pulses), can be applied to the memory cell (e.g., to the storage element of the cell) for a particular duration to program the cell to a target data state.

A memory cell can be programmed to one of a number of data states. For example, a single level memory cell (SLC) can be programmed to a targeted one of two different data states, which can be represented by the binary units 1 or 0 and can depend on whether the capacitor of the cell is charged or uncharged. As an additional example, some memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

DETAILED DESCRIPTION

Figure 1:
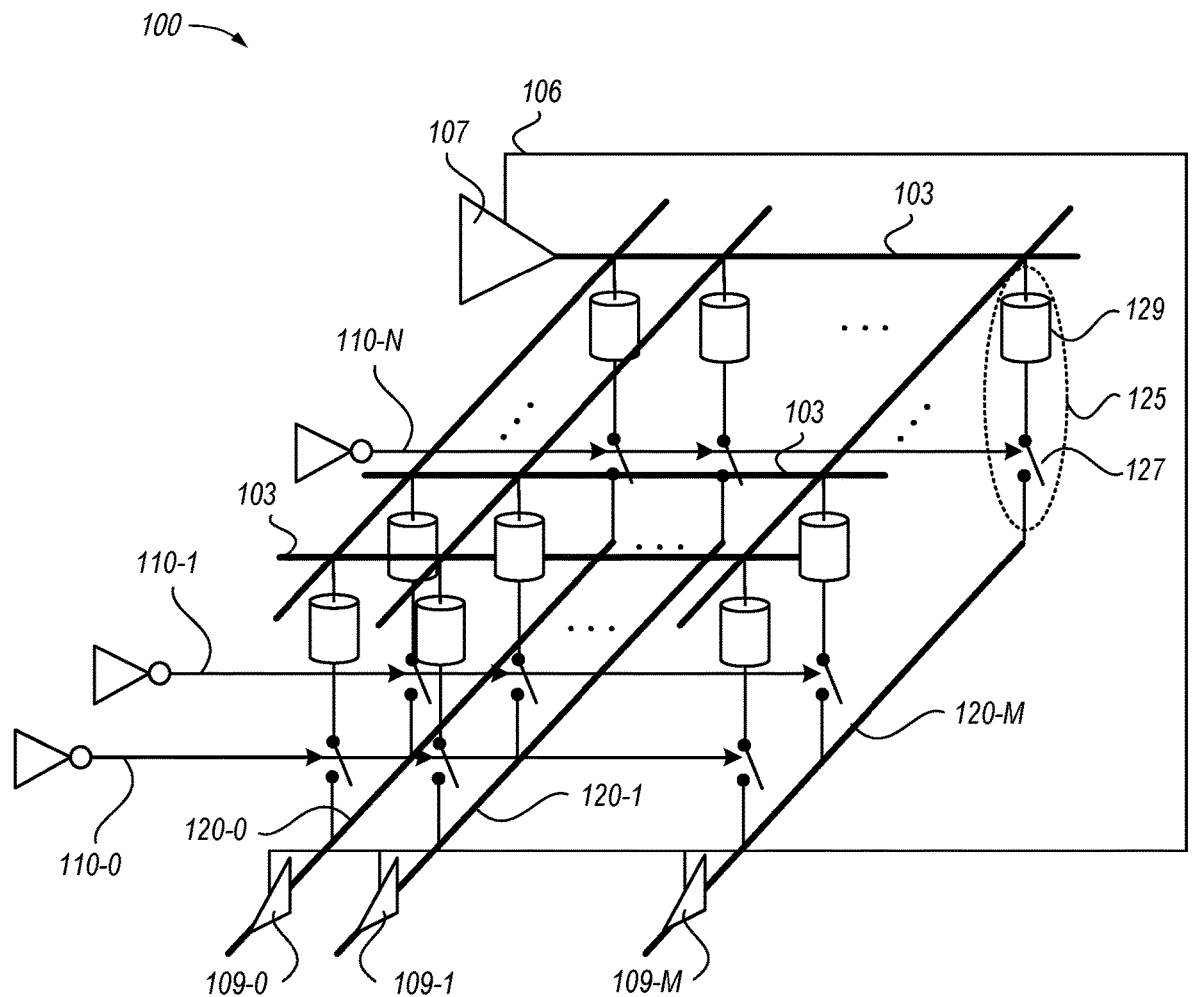
FIG. 1 is a diagram of an example of a memory array, in accordance with an embodiment of the present disclosure.

The present disclosure includes apparatuses, methods, and systems for application of an average reference voltage for sensing memory. An example apparatus includes a memory having a plurality of memory cells coupled to a common node driver, wherein a group of the memory cells are coupled to an access line and each respective memory cell of the group is coupled to a different respective sense line; sense circuitry coupled to the different respective sense lines; and circuitry configured to: apply an average reference voltage from the common node driver to the sense circuitry during a sense operation being performed on the group of memory cells coupled to the access line.

A memory device can address memory cells for operations (e.g., read and program operations) in groups (e.g., packets) called words or codewords. As memory cells are read and programmed, their response to positive or negative electrical pulses can change cycle after cycle (e.g., according to a specific electrical bias history of the code/word to which they belong).

Some memory devices can track memory cell variations (e.g., due to being read and programmed) by averaging the signal of a codeword. As such, data can be converted into a balanced codeword. Signals of the balanced codeword can be averaged to generate an appropriate reference signal for that entire codeword. That reference signal can be provided to sense amplifiers for read operations by comparing a memory cell signal to the reference signal.

Embodiments of the present disclosure can utilize the average reference voltage from a common node driver during a sense operation being performed on a group of memory cells, such as a codeword. Utilizing the average reference voltage from the common node driver can reduce and/or eliminate signal splitting and/or duplication of signals applied to sense circuitry during the sense operation. Reducing or eliminating signal splitting and/or duplication of signals applied to the sense circuitry can improve the accuracy of the reference voltage, and therefore the accuracy and/or reliability of the sense operation, by reducing parasitic signal instances and/or issues regarding signal duplication quality.

When performing a sense operation (e.g., a read operation), a memory device may access a memory cell, which may output a signal, to sense circuitry that can correspond to a value stored by the memory cell. To determine the value stored by the memory cell, the sense circuitry may compare the signal output by the memory cell to a reference voltage. The reference voltage may correspond to a voltage positioned between an expected voltage level of the signal output by a memory cell storing a first logic value and an expected voltage level of the signal output by a memory cell storing a second logic value. For instance, the sense circuitry may determine that the memory cell is storing a first logic value if the signal output by the memory cell is less than the reference voltage, and that the memory cell is storing a second logic value if the signal output by the memory cell is greater than the reference voltage.

Embodiments of the present disclosure provide that an average reference voltage can be applied from a common node driver to sense circuitry during a sense operation. The sense circuitry may compare a signal output by the memory cell to the average reference voltage from the common node driver to determine the data state of the memory cell. As mentioned, utilizing the average reference voltage from the common node driver can help eliminate signal splitting and/or duplication of signals used by the sense circuitry during the sense operation, thus improving the accuracy and/or reliability of the reference voltage.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1 illustrates an example of a memory array 100 in accordance with an embodiment of the present disclosure. Memory array 100 can be DRAM. Memory array 100 can be, for example, a ferroelectric memory (e.g., FeRAM) array.

As shown in FIG. 1, memory array 100 may include memory cells 125 that may be programmable to store different states. A memory cell 125 may include a storage element (e.g., capacitor) 129 to store a charge representative of the programmable states. For example, a charged and uncharged capacitor may respectively represent two logic states (e.g., 0 and 1). A memory cell 125 may include a capacitor with a ferroelectric material, such as, for instance, an oxide material such as lead zirconate titanate (PZT) in some examples. As an example, capacitor 129 may have a first plate (e.g., a cell plate) and a second plate (e.g., a cell bottom), where the cell plate and the cell bottom are capacitively coupled through the ferroelectric material, which is positioned between them. The orientation of cell plate and the cell bottom may be flipped without changing the operation of memory cell 125. Different levels of charge of a ferroelectric capacitor may represent different logic states, for example.

As shown in FIG. 1, a memory cell 125 may be coupled to a respective access line, such as a respective one of access lines 110-0 to 110-N, and a respective data (e.g., digit) line, such as one of data lines 120-0 to 120-M. For example, a memory cell 125 may be coupled between an access line 110 and a data line 120. In an example, access lines 110 may also be referred to as word lines, and data lines 120 may also be referred to as bit lines. Access lines 110 and data lines 120, for example, may be made of conductive materials, such as copper, aluminum, gold, tungsten, etc., metal alloys, other conductive materials, or the like.

In an example, memory cells 125 commonly coupled to an access line 110 may be referred to as a row of memory cells. For example, access lines 110 may be coupled to a row decoder (not shown in FIG. 1), and data lines 120 may be coupled to a column decoder (not shown in FIG. 1). Operations such as programming (e.g., writing) and sensing (e.g., reading) may be performed on memory cells 125 by activating or selecting the appropriate access line 110 and a data line 120 (e.g., by applying a voltage to the access line). Activating an access line 110 may electrically couple the corresponding row of memory cells 125 to their respective data lines 120.

As shown in FIG. 1, a storage element 129 can be coupled to a select device 127, such as a switch (e.g., a thin-film transistor (tft) driven by a word line 110). In the example of FIG. 1, a cell plate of the storage element 129 (e.g., capacitor or other electrically active dipole able to store different states) may be accessed via plate line 103, and a cell bottom of the storage element may be accessed via data line 120, for instance. For example, select device 127 may be used to selectively couple data line 120 to the cell bottom in response to access line 110 activating select device 127. For example, the capacitor 129 may be electrically isolated from data line 120 when select device 127 is deactivated, and capacitor 129 may be electrically coupled to data line 120 when select device 127 is activated. Activating select device 127 may be referred to as selecting memory cell 125, for example.

In an example, sources of an electric field or energy, such as positive or negative electrical pulses (e.g., positive or negative voltage or current pulses), can be applied to the storage element of memory cell 125 (e.g., to capacitor 129) for a particular duration to program the cell to a target data state. For instance, when the electric field (e.g., the electrical pulses) is applied across the ferroelectric material of capacitor 129, the dipoles of ferroelectric material may align in the direction of the applied electric field. The dipoles may retain their alignment (e.g., polarization state) after the electric field is removed, and different logic states (e.g., 0 and 1) may be stored as the different polarization states of the ferroelectric material. Accordingly, memory cell 129 may be programmed by charging a cell plate and a cell bottom of capacitor 129, which may apply an electric field across the ferroelectric material and place the ferroelectric material in a particular polarization state (e.g., depending on the polarity of the applied field) that may correspond to a particular data (e.g., logic) state. The data state of the memory cell may subsequently be determined (e.g., sensed) by determining which polarization state the ferroelectric material is in, as will be further described herein.

Furthermore, some embodiments can combine the selector device 127 and the memory element 129 in a single dipole. For these embodiments, the wordline drivers can act as common nodes drivers and the common node 103 can split in a plurality of common nodes that can be identified as wordlines 110-0 to 110-N. The memory cells of the memory array 100 can be grouped as pages or codewords that can refer to a logical unit of the memory device used to store data. One or more embodiments of the present disclosure provide that codewords may be balanced (e.g., fully balanced or partially balanced). For example, a fully balanced codeword may comprise one half of the memory cells programmed to a first data state (e.g., "0") and one half of the memory cells programmed to a second data state (e.g., "1"). A partially balanced codeword may comprise a first percentage of the memory cells programmed to a first data state (e.g., "0" or "1") and second percentage of the memory cells programmed to a second data state (e.g., "1" or "0"). Various values may be utilized for the first percentage of the memory cells programmed to a first data state. For instance, the first percentage may be 55%, 58%, or 60%, among other values. Various values may be utilized for the second percentage of the memory cells programmed to the second data state. For instance, the second percentage may be 45%, 42%, or 40%, among other values. Embodiments provide that, for partially balanced codewords, the first percentage and the second percentage are not equal, and sum to 100%.

As shown in FIG. 1, sense circuitry 109-0 to 109-M can be coupled to the different respective sense lines 120-0 to 120-M. In one or more embodiments, sense circuitry 109-0 to 109-M includes a plurality of sense amplifiers. For instance, there can be a different respective sense amplifier 109-0, 109-1, 109-M can be coupled to each respective one of the sense lines 120-0, 120-1, 120-M (e.g., sense amplifier 109-0 can correspond to sense line 120-0, sense amplifier 109-1 can correspond to sense line 120-1, etc.).

A sense operation may be performed to determine the respective data values (e.g., data states) stored by the memory cells 125 of the group (e.g., a balanced codeword). During a sense operation, a sense voltage can be applied to a particular access line, where the group of memory cells are coupled to the access line and each respective memory cell of the group is coupled to a different respective sense line, for instance, and the resulting voltage signal (e.g., in response to the sense voltage being applied to the access line) from each respective memory cell of the group of the memory cells can be provided to the sense circuitry via the different respective sense lines for comparison with a reference voltage (e.g., an average reference voltage). One or more embodiments provide that the magnitude of each of the respective voltage signals from the memory cells can be averaged to determine the average reference voltage. Embodiments of the present disclosure provide that the average reference voltage can be applied to the sense circuitry from a common node driver 107 coupled to the group of memory cells.

The data state for each respective memory cell of the group of memory cells can be determined using (e.g., by comparing) the respective voltage signal from that memory cell and the average reference voltage. For example, sense circuitry 109-0 to 109-M can compare the respective voltage signals from each respective memory cell 125 of the group of memory cells being sensed to the average reference voltage to determine a respective value stored by each of the respective memory cells 125.

As mentioned, the memory array 100 can include a common node driver 107. As shown in FIG. 1, the common node driver 107 can be coupled to the sense circuitry 109 by a connection 106; the common node driver 107 can be coupled to the group of memory cells 125 by a common node 103 (e.g., plate line).

The common node driver 107 can deliver and apply an average reference voltage to the sense circuitry 109-0 to 109-M (e.g., via connection 106). Embodiments provide that the average reference voltage, as discussed further herein, may be determined in a number of different ways. Regardless of how the average reference voltage is determined, the common node driver 107 can apply the average reference voltage to the sense circuitry 109-0 to 109-M by the connection 106.

One or more embodiments provide that that common node driver 107 is configured to provide a voltage signal having a magnitude that is equal to an average of the voltage signals provided from each respective memory cell 125 of the group of the memory cells to the sense circuitry 109-0 to 109-M via the different respective sense lines 120-0 to 120-M. For instance, due to charge conservation, the common node 103 can provide a total signal (e.g. a magnitude) equal to the sum of respective signals, weighted by a sum of capacitances, which each memory cell 125 of the group of memory cells being sensed provides to the sense circuitry 109-0 to 109-M. The magnitudes of the voltage signals provided from each respective memory cell of the group can be averaged, without splitting or duplicating the voltage signals, to determine the average reference voltage that is applied to the sense circuitry.

The memory cells 125 may be capacitance variable memory cells, for example. The memory cells 125 may include a material programmable to different data states. In the example illustrated in FIG. 1, each of memory cells 125 may include a select element 127 (e.g., a switch, such as a thin-film transistor (tft) driven by a word line) that is separate from a storage element 129. For instance, each of memory cells 125 may include a select element 127 that is coupled in series with a storage element 129. As shown in the embodiment of FIG. 1, the select element 127 (e.g., switch) can be located between the storage element 129 and the bit line 120. However, embodiments are not so limited. For instance, some embodiments provide that the select element 127 (e.g., tft driven by a word line 110) can be between the storage element 129 and the common node (e.g., plate line 103).

Figure 2A:
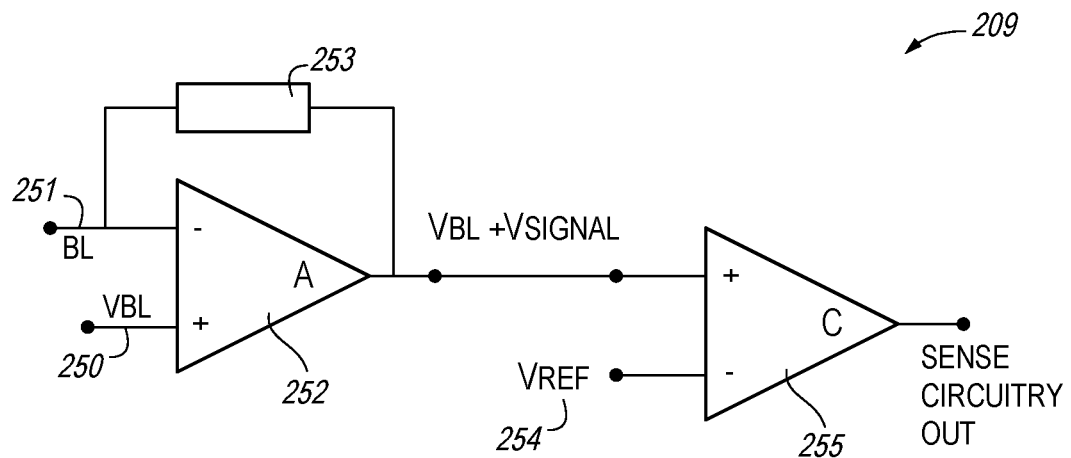
FIG. 2A illustrates a portion of sense circuitry according to an embodiment of the present disclosure.

FIG. 2A illustrates a portion of sense circuitry 209 according to an embodiment of the present disclosure. Sense circuitry 209 can be, for example, sense circuitry 109-0 to 109-M previously described in connection with FIG. 1. While FIG. 2A represents an embodiment of the present disclosure, other architectures for sense circuitry may be utilized in accordance with the present disclosure.

As illustrated in FIG. 2A, the sense circuitry 209 can include an operational amplifier 252. The operational amplifier 252 can amplify a signal (e.g., a voltage or a current) utilizing an external feedback component 253. In one or more embodiments, the external feedback component 253 is a resistor. However, embodiments are not so limited. For instance, in one or more embodiments, the external feedback component 253 is a capacitor.

The operational amplifier 252 includes a non-inverting input 250 (+) that is coupled to a bias (VBL), which can define the bit line bias, and an inverting input (−) 251 that is coupled to a second signal line (e.g., a bit line 120-0 to 120-M as shown in FIG. 1) to set the bias and, in turn, the cell bias.

The operational amplifier 252 can provide an output (e.g., VBL+Vsignal), where Vsignal is a product of a value of the external feedback component 253 and a signal obtained from a memory cell coupled to the second signal line (e.g., the bit line associated with the inverting input (−) 251) during a sense operation. Vsignal may be either positive or negative depending upon a value of the bias (VBL).

The sense circuitry can include a comparator 255. As shown in FIG. 2A, the operational amplifier 252 output (e.g., VBL+Vsignal) can be input to the comparator 255 to be compared to an average reference voltage 254 to determine a data state of a memory cell coupled to the second signal line (e.g., the bit line associated with the inverting input (−) 251). For instance, the output of the comparator 255 can indicate the data state of the memory cell.

Figure 2B:
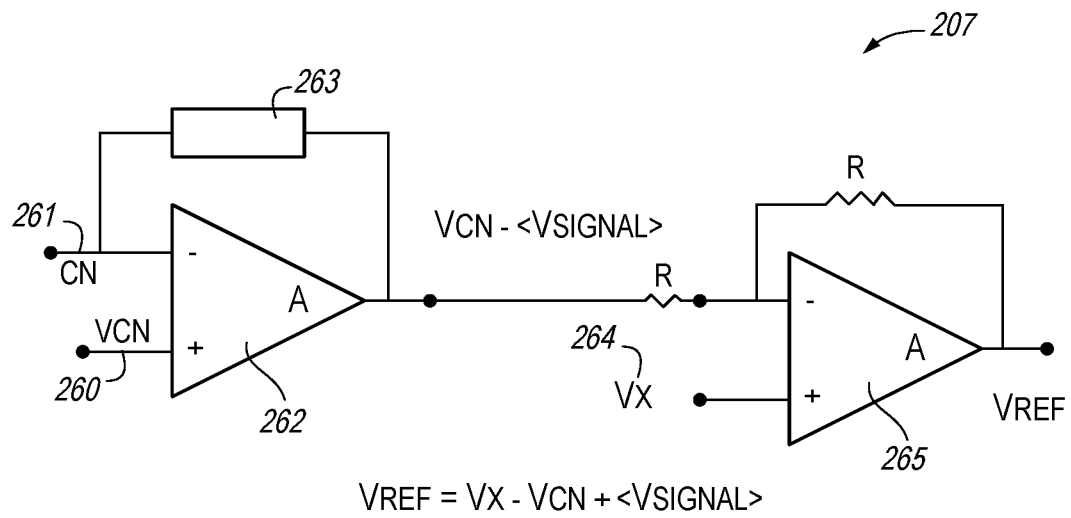
FIG. 2B illustrates a portion of a common node driver according to an embodiment of the present disclosure.

FIG. 2B illustrates a portion of a common node driver 207 according to an embodiment of the present disclosure. Common node driver 207 can be, for example, common node driver 107 previously described in connection with FIG. 1. As mentioned, the common node driver can apply the average reference voltage from the common node driver to the sense circuitry during a sense operation being performed on a group of memory cells.

As illustrated in FIG. 2B, the common node driver 207 can include an operational amplifier 262. The operational amplifier 262 can amplify a signal (e.g., a voltage or a current) utilizing an external feedback component 263. In one or more embodiments, the external feedback component 263 is a resistor. However, embodiments are not so limited. For instance, in one or more embodiments, the external feedback component 263 is a capacitor. The operational amplifier 262 includes a non-inverting input 260 (+) that is coupled to a bias (VCN), which can define the common node bias, and an inverting input (−) 261 that is coupled to a common node (e.g., a common node 103 as shown in FIG. 1) to set the bias and, in turn, the bias of the cells grouped as a page or codeword.

The operational amplifier 262 can provide an output (e.g., VCN−<Vsignals>), where <Vsignals> represents the signals from each of the memory cells (e.g., a codeword), for which data states are being determined during the sense operation. For instance, the operational amplifier 262 can be described as a control node voltage (VCN) minus the average of memory cells signals associated with the sense operation. The current direction of the control node (CN) is opposite with respect to the sense circuitry, which results in the minus sign mentioned above.

Due to the plurality of memory cells (e.g., corresponding to a codeword), for which data states are being determined during the sense operation, the feedback component 263 can have a resistance or capacitance value that is smaller than the resistance or capacitance value of the external feedback component 253 shown in FIG. 2A. For instance, the feedback component 263 can have a resistance value equal to a quotient of a resistance of the external feedback component 253 shown in FIG. 2A and a codeword length associated with the sense operation. Alternatively, the feedback component 263 can have a capacitance value equal to a product of a capacitance of the external feedback component 253 shown in FIG. 2A and a codeword length associated with the sense operation.

The common node driver can include an inverting amplifier 265. The inverting amplifier 265 can invert the operational amplifier 262 output to provide the average reference voltage (Vref). One or more embodiments provide that Vref=Vx−VCN+<Vsignals>. Vx 264 can be set such that Vx=VBL+VCN. As mentioned, the average reference voltage can be determined without utilizing signal splitting and/or duplication of signals.

Vref can then be input into sense circuitry 209. For instance, the sense circuitry 209 can compare VBL+Vsignal (e.g., a signal from one memory cell associated with a sense operation) against VBL+<Vsignals>, where, as mentioned, <Vsignals> represents the signals from each of the memory cells (e.g., a codeword), for which data states are being determined during the sense operation. This comparison by the sense circuitry (e.g., comparing the voltage signal from a respective memory cell to the average reference voltage) can be used to determine the data state for each respective memory cell associated with the sense operation.

Figure 3:
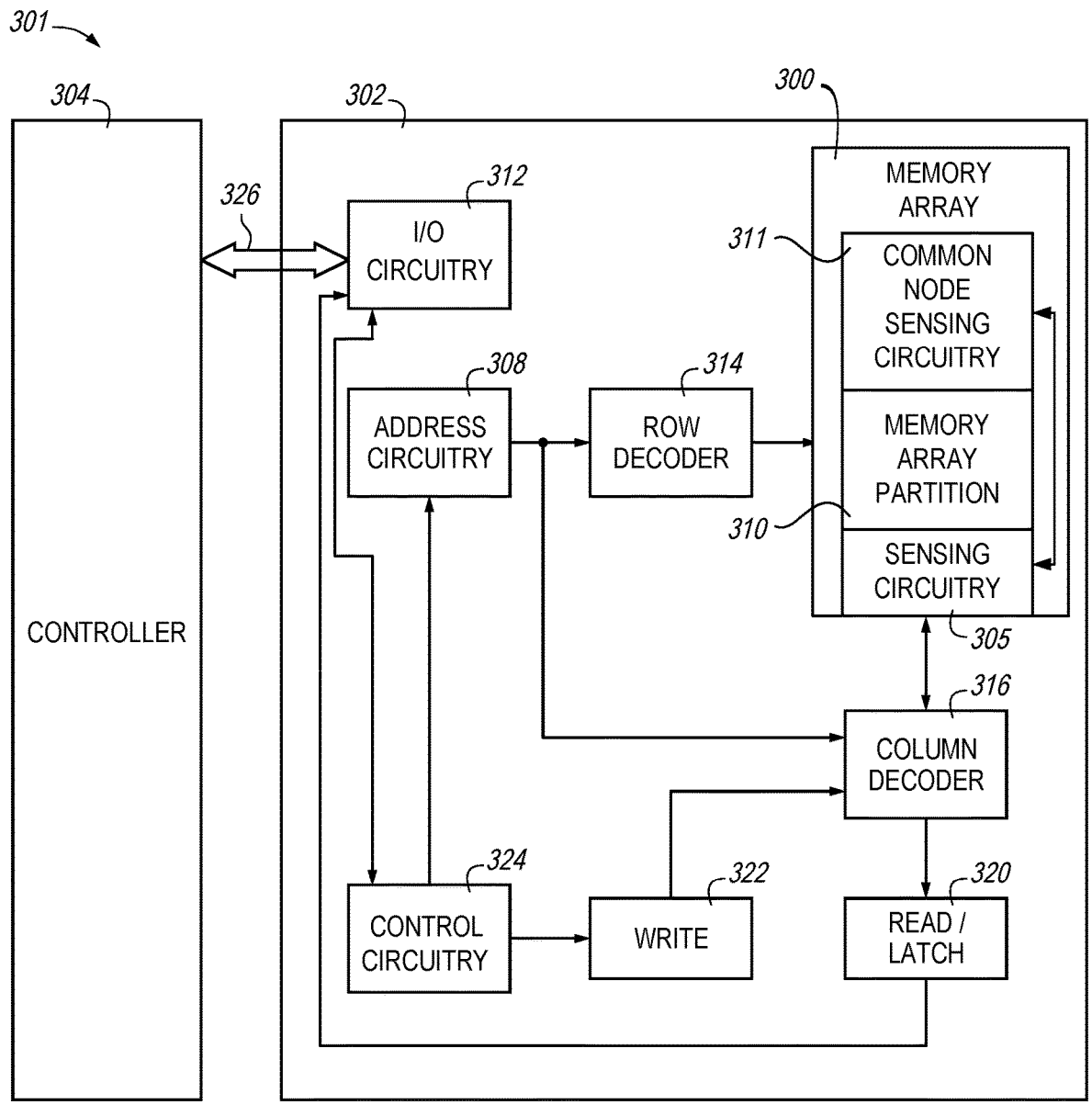
FIG. 3 is a block diagram illustration of an example apparatus, in accordance with an embodiment of the present disclosure.

FIG. 3 is a block diagram illustration of an example apparatus, such as an electronic memory system 301, in accordance with an embodiment of the present disclosure. Memory system 301 may include an apparatus, such as a memory device 302 and a controller 304, such as a memory controller (e.g., a host controller). Controller 304 might include, for example. Controller 304 might be coupled to a host, for example, and may receive command signals (or commands), address signals (or addresses), and data signals (or data) from the host and may output data to the host.

Memory device 302 includes a memory array 300 of memory cells. Memory array 300 may comprise a plurality of sub-arrays and/or partitions 310 (e.g., sub-matrixes). Memory (sub)array 300, 310 can be, for instance, memory array 100 previously described in connection with FIG. 1. In one or more embodiments, the memory cells of memory array 300 can be single level cells (SLCs). The memory array 300 may include one or more of the memory arrays, such as a cross-point array, of memory cells discussed herein. Memory device 302 may include address circuitry 308 to latch address signals provided over I/O connections 326 through I/O circuitry 312. Address signals may be received and decoded by a row decoder 314 and a column decoder 316 to access the memory array 300. For example, row decoder 314 and/or column decoder 316 may include drivers.

Controller 304 may sense (e.g., read) data in memory array 300 using the sense circuitry 305, common node sensing circuitry 311, and the average reference voltage discussed herein. In one or more embodiments, the memory device 302 may include read/latch circuitry 320, which may read and latch data from the memory array 300. Sensing circuitry 305, as discussed herein (e.g., FIG. 2A and FIG. 2B) may include a number of sense amplifiers coupled to memory cells of memory array 300. Additionally, the sensing circuitry 305 may operate in combination with the read/latch circuitry 320 to sense (e.g., read) memory states from targeted memory cells. I/O circuitry 312 may be included for bi-directional data communication over the I/O connections 326 with controller 304. Write circuitry 322 may be included to write data to memory array 300.

As an example, during a sense operation (e.g., a read operation), a sense voltage can be applied to a group (e.g., a data codeword) of the memory cells of the array 300, wherein each respective memory cell of the group is coupled to a same access line and a different respective sense line. Voltage signals from each respective memory cell of the group of the memory cells can be obtained (e.g., via the sense line coupled to that respective memory cell). Obtaining the voltage signals from each respective memory cell of the group can provide that the magnitude of each of the respective voltage signals is averaged to determine the average reference voltage. The average reference voltage can be applied to sensing circuitry 305 (e.g., a plurality of sense components, such as sense amplifiers) via the common node driver (e.g., common node sensing circuitry 311) coupled to the to the array 300. The sensing circuitry 305 can then compare the voltage signals from the memory cells of the group to the average reference voltage to determine a data state of each of the memory cells of the group.

Further, in one or more embodiments, a different sense operation (e.g., a different read operation, such a subsequent read operation) may be performed. A different sense voltage can be applied to a different group of memory cells of the array 300, wherein each respective memory cell of the different group is coupled to a different same access line and a different respective sense line. Another voltage signal can be obtained from each respective memory cell of the different group via the different respective sense line coupled to the respective memory cell. A magnitude of each of the respective voltage signals can be averaged to determine a different average reference voltage. The different average reference voltage can be applied to a different plurality of sense components via the common node driver (e.g., common node sensing circuitry 311) coupled to the to the array 300. The sensing circuitry 305 can then compare the voltage signals the memory cells of the different group to the different average reference voltage to determine a data state of each of the memory cells of the different group. As such, one or more embodiments provide that average reference voltage may have a plurality of values. For instance, the average reference voltage may have respective value for each different respective sense operation that is performed.

Control circuitry 324 may decode signals provided from controller 304. These signals may include chip signals, write enable signals, and address latch signals that are used to control the operations on memory array 300, including data read and data write operations.

Control circuitry 324 may be included in controller 304, for example. Controller 304 may include other circuitry, firmware, software, or the like, whether alone or in combination. Controller 304 may be an external controller (e.g., in a separate die from the memory array 300, whether wholly or in part) or an internal controller (e.g., included in a same die as the memory array 300). For example, an internal controller might be a state machine or a memory sequencer.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. he scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory having a plurality of memory cells coupled to a common node driver, wherein a group of the memory cells are coupled to an access line and each respective memory cell of the group is coupled to a different respective sense line;
sense circuitry coupled to the different respective sense lines and to the group of memory cells via the different respective sense lines; and
circuitry configured to apply an average reference voltage from the common node driver to the sense circuitry during a sense operation being performed on the group of memory cells coupled to the access line and whose data states are being sensed by the sense operation, wherein the average reference voltage is an average of magnitudes of voltage signals provided from the group of memory cells via the different respective sense lines.

2. The apparatus of claim 1, wherein the sense circuitry is configured to compare, during the sense operation, the average reference voltage from the common node driver to a voltage signal from each respective memory cell of the group of the memory cells coupled to the access line.

3. The apparatus of claim 1, wherein, during the sense operation, the common node driver is configured to provide a voltage signal having a magnitude that is equal to the average of the magnitudes of the voltage signals provided from each respective memory cell of the group of the memory cells to the sense circuitry via the different respective sense lines.

4. The apparatus of claim 3, wherein the circuitry is configured to average the magnitudes of the voltage signals provided from each respective memory cell of the group of memory cells to determine the average reference voltage.

5. The apparatus of claim 4, wherein the circuitry is configured to average the magnitudes of the voltage signals to determine the average reference voltage without splitting or duplicating the voltage signals.

6. The apparatus of claim 1, wherein the group of the memory cells comprises a balanced codeword.

7. A method of operating memory, comprising:
applying a sense voltage to an access line during a sense operation, wherein a group of memory cells whose data states are being sensed by the sense operation are coupled to the access line and each respective memory cell of the group is coupled to a different respective sense line; and
applying an average reference voltage from a common node driver coupled to the group of memory cells to sense circuitry during the sense operation, wherein the average reference voltage is an average of magnitudes of voltage signals provided from the group of memory cells via the different respective sense lines, and the sense circuitry is coupled to the group of memory cells via the different respective sense lines.

8. The method of claim 7, wherein the method includes providing a voltage signal from each respective memory cell of the group of the memory cells to the sense circuitry via the different respective sense lines during the sense operation.

9. The method of claim 8, wherein the method includes averaging a magnitude of each of the respective voltage signals to determine the average reference voltage.

10. The method of claim 8, wherein the method includes determining the data state for each respective memory cell of the group of memory cells using the voltage signal from that respective memory cell and the average reference voltage.

11. The method of claim 10, wherein determining the data state for each respective memory cell of the group of memory cells includes comparing the voltage signal from that respective memory cell to the average reference voltage.

12. The method of claim 7, wherein half of the memory cells of the group of memory cells are programmed to a first data state and half of the memory cells of the group of memory cells are programmed to a second data state that is different than the first data state.

13. An apparatus, comprising:
an array of memory cells; and
circuitry coupled to the array and configured to, during a sense operation:
apply a sense voltage to a group of the memory cells of the array whose data states are being sensed during the sense operation, wherein each respective memory cell of the group is coupled to a same access line and a different respective sense line;

obtain a voltage signal from each respective memory cell of the group of the memory cells via the sense line coupled to that respective memory cell;

average a magnitude of each of the respective voltage signals to determine an average reference voltage; and apply the average reference voltage to a plurality of sense components via a common node driver coupled to the to the array, wherein the plurality of sense components are coupled to the group of memory cells via the different respective sense lines.

14. The apparatus of claim 13, wherein the plurality of sense components comprise a plurality of sense amplifiers.

15. The apparatus of claim 14, wherein each respective sense amplifier of the plurality of sense amplifiers is coupled to a different respective one of the sense lines.

16. The apparatus of claim 14, wherein the sense components are configured to compare the voltage signals from the memory cells of the group to the average reference voltage to determine the data state of each of the memory cells of the group.

17. The apparatus of claim 13, wherein the group of memory cells correspond to a balanced codeword.

18. The apparatus of claim 13, wherein each memory cell of the group of memory cells comprises a select element coupled in series with a storage element.

19. The apparatus of claim 13, wherein the circuitry is configured to, during a different sense operation:

apply a different sense voltage to a different group of memory cells of the array, wherein each respective memory cell of the different group is coupled to a different same access line and a different respective sense line; and obtain another voltage signal from each respective memory cell of the different group via the different respective sense line coupled to the respective memory cell;

average a magnitude of each of the respective voltage signals to determine a different average reference voltage; and apply the different average reference voltage to a different plurality of sense components via the common node driver coupled to the to the array.

20. The apparatus of claim 19, wherein the sense components are configured to compare the voltage signals of the memory cells of the different group to the different average reference voltage to determine a data state of each of the memory cells of the different group.

* * * * *